United States Patent
Ng et al.

(10) Patent No.: US 9,698,227 B2
(45) Date of Patent: Jul. 4, 2017

(54) FINFET WITH TRENCH FIELD PLATE

(71) Applicant: Taiwan Semiconductor Manufacturing Company, Ltd., Hsin-Chu (TW)

(72) Inventors: Chun-Wai Ng, Hsin-Chu (TW); Hsueh-Liang Chou, Jhubei (TW); Po-Chih Su, New Taipei (TW); Ruey-Hsin Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/584,823

(22) Filed: Dec. 29, 2014

(65) Prior Publication Data
US 2015/0118814 A1 Apr. 30, 2015

Related U.S. Application Data

(62) Division of application No. 13/546,738, filed on Jul. 11, 2012, now Pat. No. 8,921,934.

(51) Int. Cl.
| | |
|---|---|
| *H01L 29/36* | (2006.01) |
| *H01L 29/40* | (2006.01) |
| *H01L 29/66* | (2006.01) |
| *H01L 29/78* | (2006.01) |
| *H01L 29/06* | (2006.01) |

(52) U.S. Cl.
CPC ........ *H01L 29/401* (2013.01); *H01L 29/0684* (2013.01); *H01L 29/36* (2013.01); *H01L 29/404* (2013.01); *H01L 29/407* (2013.01); *H01L 29/66704* (2013.01); *H01L 29/7824* (2013.01); *H01L 29/7825* (2013.01); *H01L 29/7856* (2013.01)

(58) Field of Classification Search
CPC ............ H01L 29/407; H01L 29/66704; H01L 29/7824; H01L 29/7825; H01L 29/7856; H01L 29/401; H01L 29/404; H01L 29/0684
USPC ....................................................... 438/283
See application file for complete search history.

(56) References Cited

U.S. PATENT DOCUMENTS

| | | |
|---|---|---|
| 7,667,268 B2 | 2/2010 | Disney et al. |
| 2002/0105025 A1 | 8/2002 | Fujihira |
| 2003/0001198 A1 | 1/2003 | Bromberger et al. |
| 2003/0178670 A1 | 9/2003 | Fried et al. |
| 2005/0082591 A1 | 4/2005 | Hirler et al. |
| 2007/0278568 A1 | 12/2007 | Williams et al. |

(Continued)

FOREIGN PATENT DOCUMENTS

WO    2012015550    2/2012

*Primary Examiner* — Jerome Jackson, Jr.
*Assistant Examiner* — Bo Fan
(74) *Attorney, Agent, or Firm* — Slater Matsil, LLP

(57) ABSTRACT

An integrated circuit device includes a pad layer having a body portion with a first doping type laterally adjacent to a drift region portion with a second doping type, a trench formed in the pad layer, the trench extending through an interface of the body portion and the drift region portion, a gate formed in the trench and over a top surface of the pad layer along the interface of the body portion and the drift region portion, an oxide formed in the trench on opposing sides of the gate, and a field plate embedded in the oxide on each of the opposing sides of the gate.

20 Claims, 9 Drawing Sheets

(56) References Cited

U.S. PATENT DOCUMENTS

| | | |
|---|---|---|
| 2008/0038890 A1 | 2/2008 | Tucker |
| 2010/0096697 A1 | 4/2010 | Su et al. |
| 2010/0155773 A1* | 6/2010 | Parthasarathy ....... H01L 29/407 257/139 |
| 2014/0346590 A1* | 11/2014 | Meiser .............. H01L 29/66734 257/330 |

* cited by examiner

FINFET WITH TRENCH FIELD PLATE

This application is a divisional of and claims the benefit of U.S. application Ser. No. 13/546,738, filed Jul. 11, 2012, entitled, "FinFET with Trench Field Plate," which application is hereby incorporated herein by reference

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits. Integrated circuits include field-effect transistors (FETs) such as metal oxide semiconductor (MOS) transistors.

One of the goals of the semiconductor industry is to continue shrinking the size and increasing the speed of individual FETs. FinFETs not only improve areal density, but also improve gate control of the channel.

The on-resistance of conventional FinFET device may be limited by a number of factors. These include, for example, the channel density and the doping concentration of the drift region.

BRIEF DESCRIPTION OF THE DRAWINGS

For a more complete understanding of the present disclosure, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of embodiments are discussed in detail below. It should be appreciated, however, that the present disclosure provides many applicable concepts that can be embodied in a wide variety of specific contexts. The specific embodiments discussed are merely illustrative, and do not limit the scope of the disclosure.

The present disclosure will be described with respect to embodiments in a specific context, namely a FinFET metal oxide semiconductor (MOS). The concept may also be applied, however, to other integrated circuits and electronic structures including, but not limited to, multiple gate field-effect transistor (MuGFET) and nanowire devices.

Figure 1:
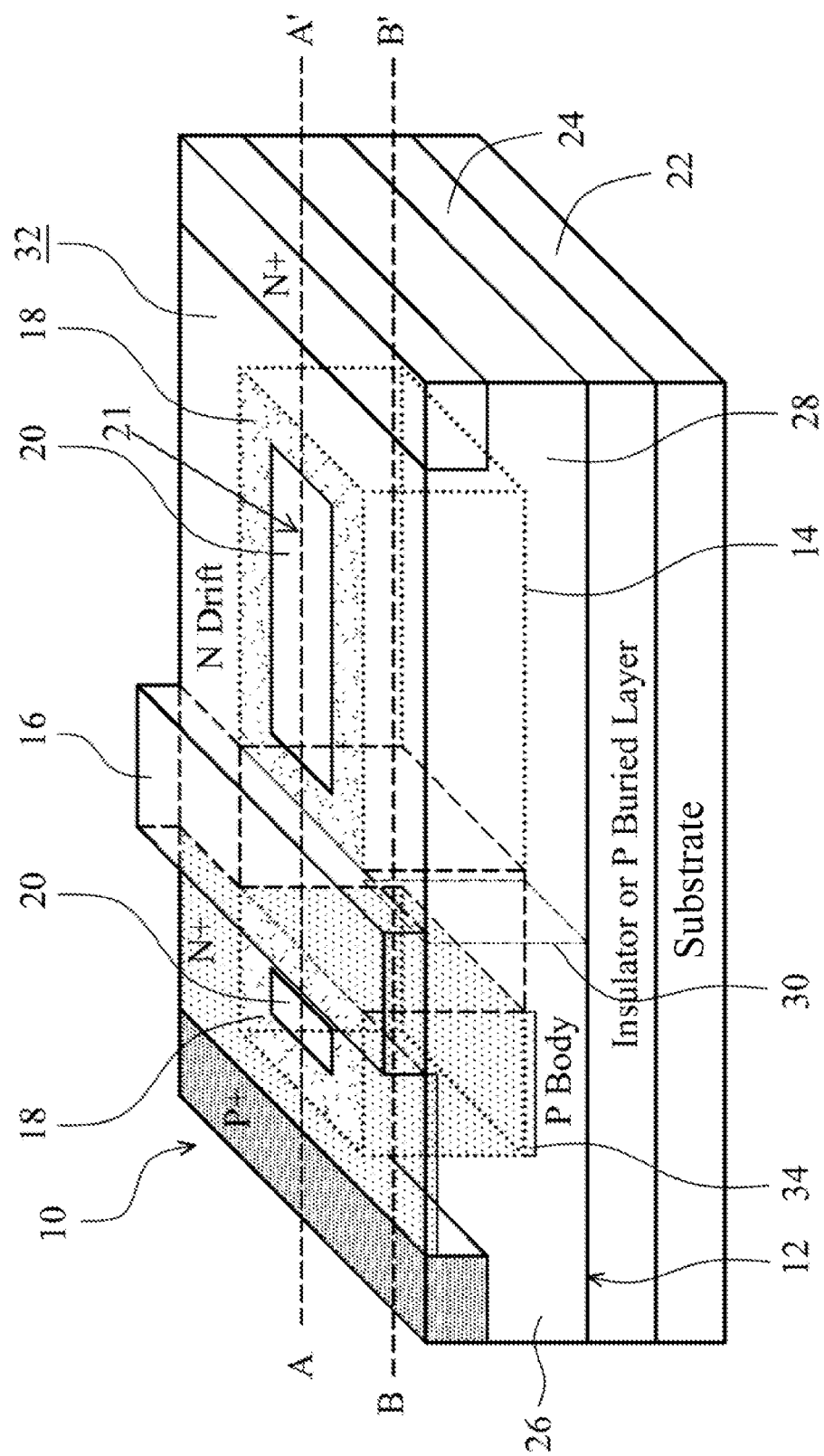
FIG. 1 is a perspective view of a representative portion of an embodiment FinFET device incorporating a trench field plate.
Figure 2:
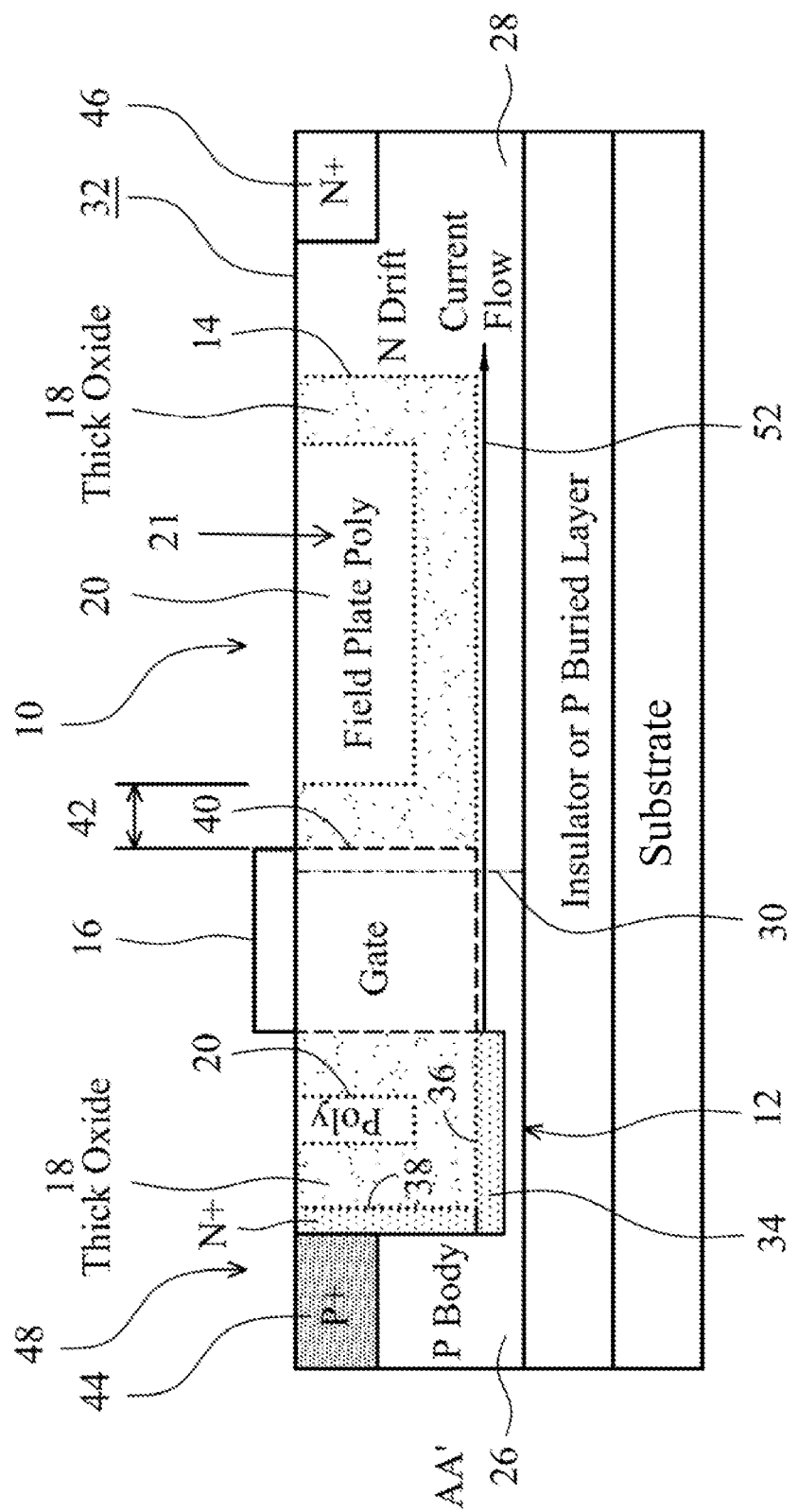
FIG. 2 is a cross section of the FinFET device of FIG. 1 taken generally along line A-A'.
Figure 3:
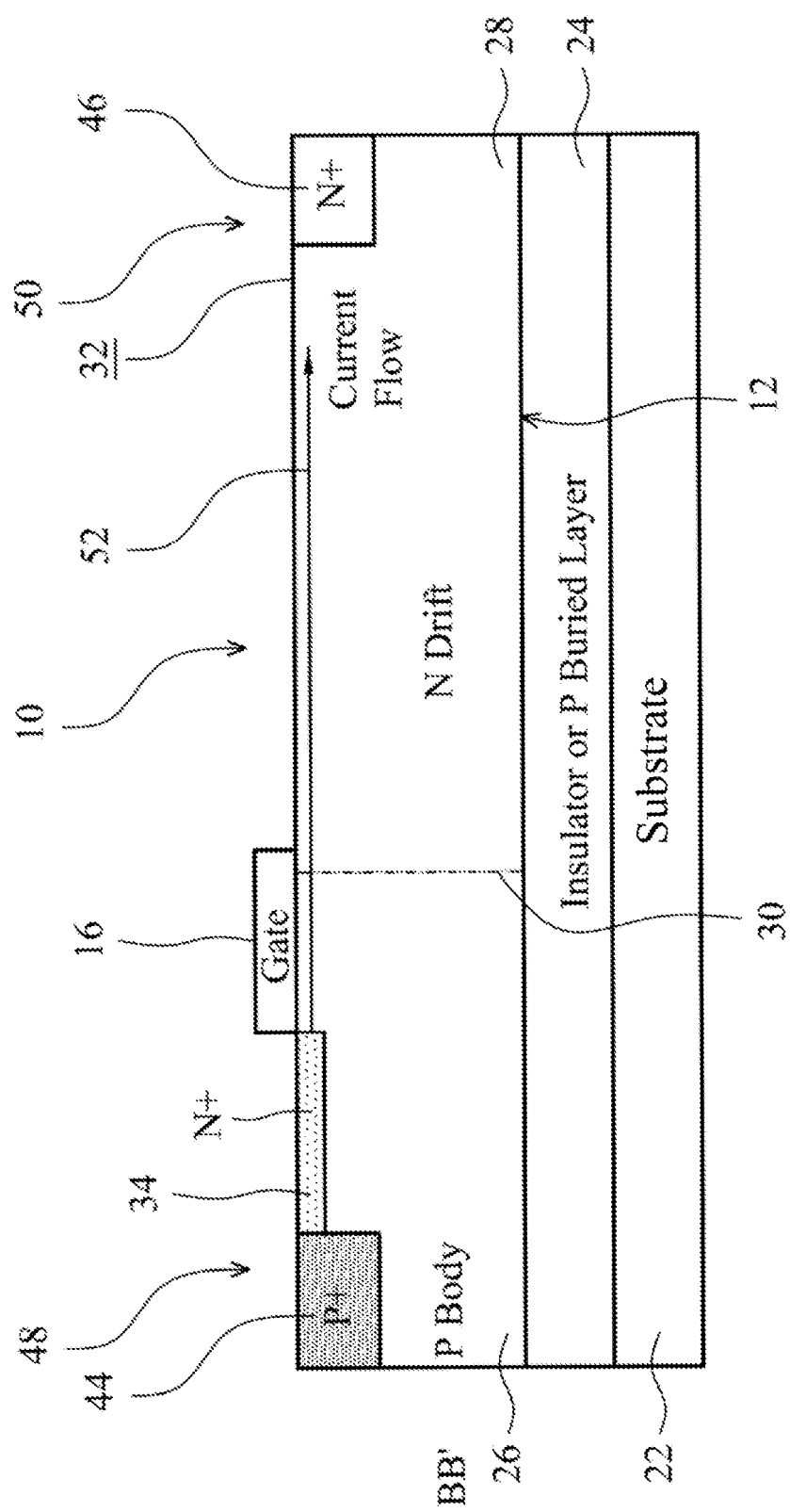
FIG. 3 is a cross section of the FinFET device of FIG. 1 taken generally along line B-B'.

Referring now to FIGS. 1-3, an embodiment FinFET device 10 is illustrated. As will be more fully explained below, the FinFET device 10 provides reduced channel and drift region resistances and reduced overall device specific on-resistance. In addition, the FinFET device 10 may be formed using a simplified process with a reduced mask count. As shown in FIGS. 1-3, the FinFET device 10 generally includes a pad layer 12, a trench 14, a gate 16, a dielectric material 18, and a field plate material 20 used to form a field plate 21.

As shown in FIGS. 1-3, the pad layer 12 is supported by a substrate 22 and a buried layer 24. In an embodiment, the substrate 22 is formed from a semiconductor material and the buried layer 24 is an insulator, a p-doped buried layer, or other suitable material. In an embodiment, the pad layer 12 is formed from n-type semiconductor material or implanted with n-type impurities. The pad layer 12 is generally divided into a p-doped body portion 26 laterally or horizontally adjacent to an n-doped drift region portion 28. The body portion 26 and the drift region portion 28, as well as other structures of the FinFET device 10, may be otherwise doped in different embodiments.

Still referring to FIGS. 1-3, the trench 14 is generally formed into the pad layer 12. In an embodiment, the trench 14 extends through an interface 30 of the body portion 26 and the drift region portion 28. In other words, the trench 14 is partially formed in both the body portion 26 and the drift region portion 28. In an embodiment, a longest dimension of the trench 14, which is the horizontal length of the trench 14 in FIG. 1, is orthogonal to the interface 30 of the body portion 26 and the drift region portion 28. In an embodiment, the trench 14 is formed using a masking and dry-etch process.

In an embodiment, the gate 16 is formed in the trench 14 and over a top surface 32 of the pad layer 12 along the interface 30 of the body portion 26 and the drift region portion 28. In an embodiment, the longest dimension of the trench 14, which is the horizontal length of the trench 14 in FIG. 1, is orthogonal to a longest dimension of the gate 16. In an embodiment, the gate 16 is formed from polysilicon and/or other suitable gate materials. As shown, a vertical height of the gate is greater than a depth of the trench 14. As such, the gate 16 protrudes above the top surface 32 of the pad layer 12. By using a three-dimensional gate 16 (a.k.a., a folded gate), the channel density of the FinFET device 10 is increased and the channel resistance is reduced.

As shown in FIGS. 1-3, in an embodiment a thin layer 34 of the body portion 26 of the pad layer 12 adjacent the gate 16 is heavily n-doped relative to n-doped drift region portion 28. The heavily n-doped thin layer 34 of the body portion 26 is generally disposed beneath a trench floor 36, behind trench sidewalls 38, and beneath the top surface 32 of the pad layer 12 adjacent the gate 16 as shown in FIG. 2. In an embodiment, the thin layer 34 is formed through an implantation process.

Still referring to FIGS. 1-3, the dielectric material 18 is formed in the trench 14 on opposing sides of the gate 16. The dielectric material 18 may be formed through, for example, deposition or a thermal oxidization process. In an embodiment, the dielectric material 18 is comprises an oxide layer. In an embodiment, the dielectric material 18 is formed on the trench sidewalls 36, the trench floor 38, and on gate sidewalls 40 as shown in FIG. 2. In an embodiment, the dielectric material 18 has a thickness 42 of between about one hundred Angstroms (100 A) and about ten micrometers (10 μm).

As shown in FIGS. 1-2, a field plate material 20 is embedded in the dielectric material on right hand side (i.e., drain side) of the gate 16 to form the field plate 21. In an embodiment, the same or similar field plate material 20 is embedded in the dielectric material 18 on the left hand side of the gate 16 as well. However, there is no field plate effect and, therefore, no field plate 21, on the left hand side/source side. In an embodiment, the field plate material 20 comprises polysilicon and/or other suitable materials having electrical conductivity. As shown, the field plate material 20 is formed in the trench 14 in separate and distinct segments on both sides of the gate 16. In an embodiment, top surfaces of the field plate material 20 and the dielectric material 18 are co-planar as shown in FIG. 2. By using the field plate 21, the drift region concentration is increased for the same breakdown voltage and the drift region resistance is reduced. By reducing both the channel resistance and the drift region resistance, the overall on-resistance of the FinFET device 10 is reduced.

Still referring to FIGS. 1-3, a highly p-doped region 44 is formed on one end of the FinFET device 10 and a highly n-doped region 46 is formed on the other. The highly p-doped region 44 functions as, functions as part of, a source 48 of the FinFET device 10. The highly n-doped region 46 functions as a drain 50 for the FinFET device 10.

As shown in FIGS. 1-3, the same trench 14 is used to form the source 48, the gate 16, and the field plate 21. Indeed, the size and shape of the trench 14 directly impacts the size and position of the source 48. In addition, in an embodiment the trench 14 generally contains or is filled by the field plate material 20, the dielectric material 18 and a portion of the gate 16.

Referring now to FIGS. 2-3, in an embodiment the trench 14 may be extended to the drain 50 to provide for uniform current flow 52 through the FinFET device 10. In addition, in an embodiment the breakdown voltage of the FinFET device 10 may be modified by adjusting a length of the field plate 21 and/or a length of the drift region portion 28.

Figure 4:
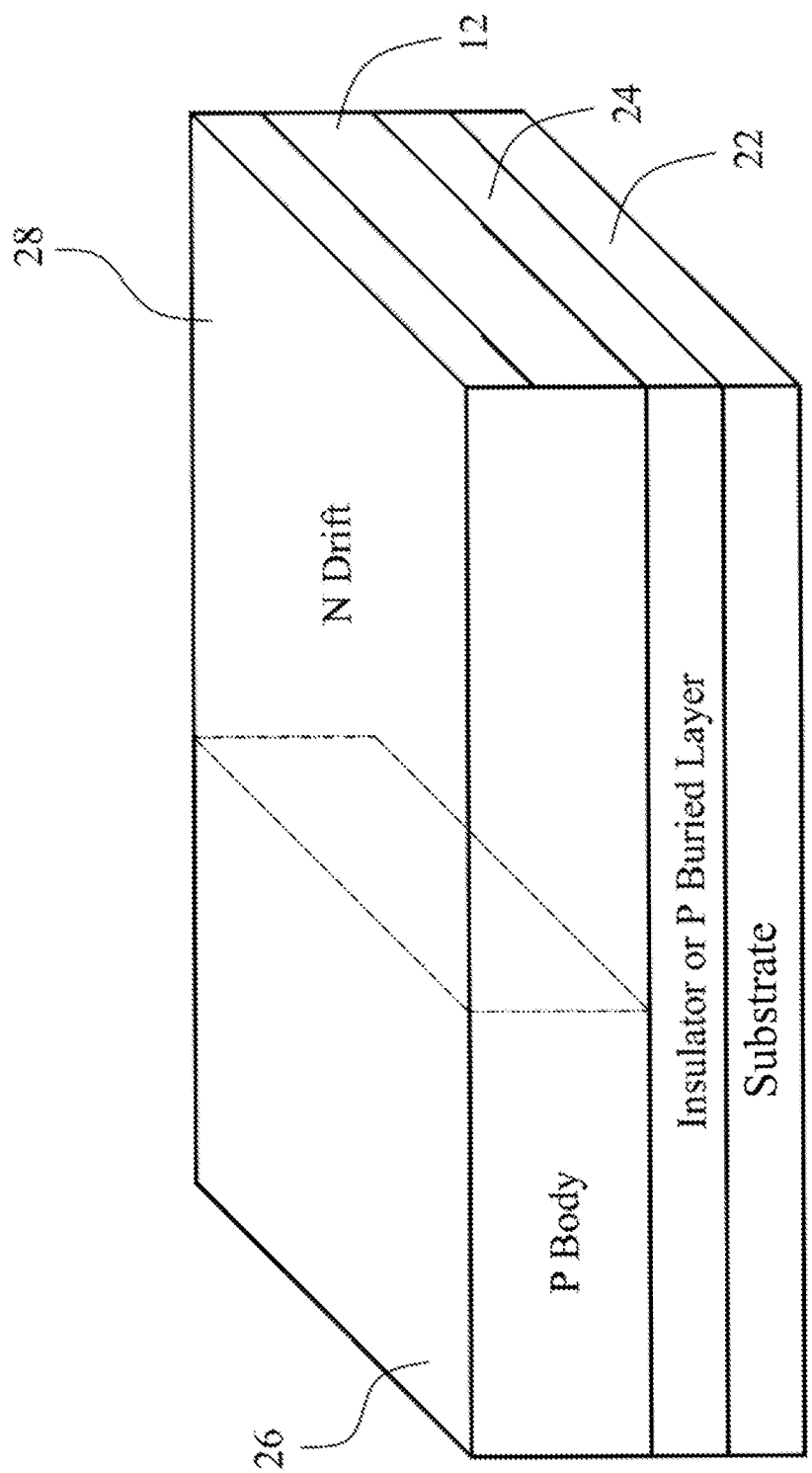
FIGS. 4-9 collectively schematically illustrate an embodiment method of forming the FinFET device of FIG. 1.

Referring to FIGS. 4-9, an embodiment method of forming the FinFET device 10 is collectively illustrated. Beginning with FIG. 4, the pad layer 12 is formed above the substrate 22 and the buried layer 24. Thereafter, a first masking process is employed to define an active region, which is the region of the pad layer 12 depicted in FIG. 4. In other words, the region outside of what is shown in FIG. 4 is covered by the mask. After the active region is defined, the pad layer 12 is oxidized and the body portion 26 of the pad layer 12 is subjected to a p-type implantation process to differentiate it from the n-doped drift region portion 28. In an embodiment, the pad layer 12 is formed from n-type semiconductor material.

Figure 5:
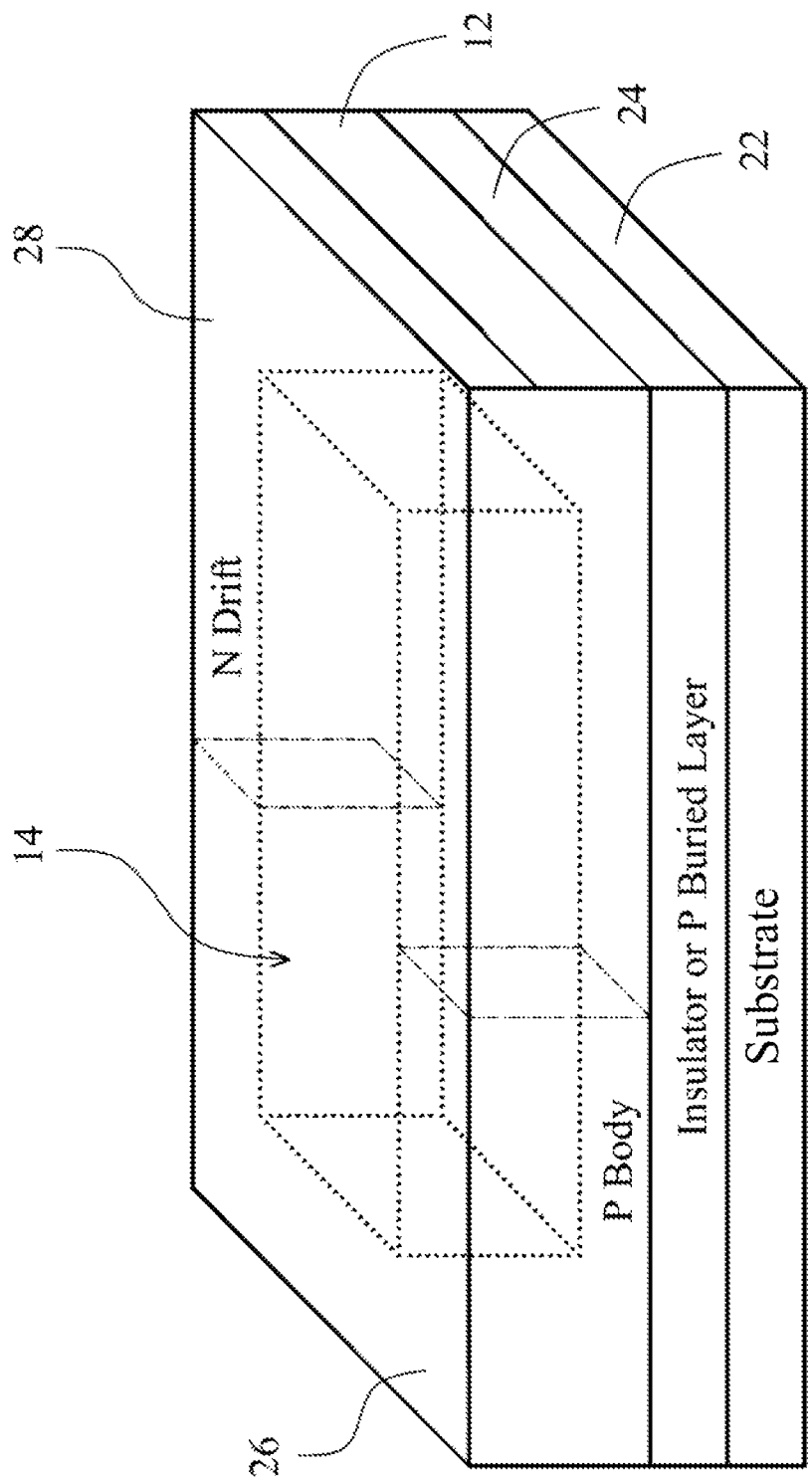
Figure 6:
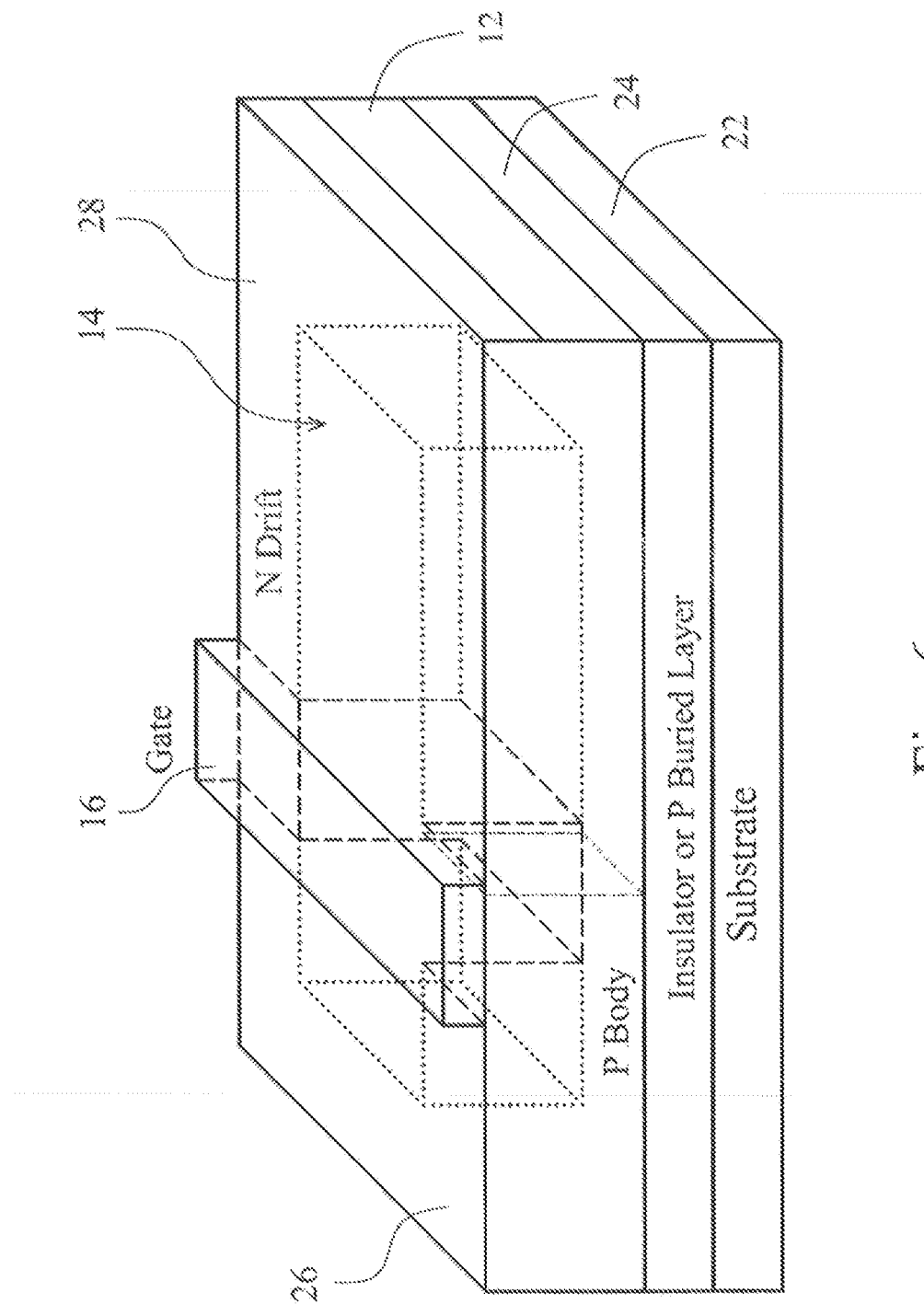

Next, as shown in FIG. 5, the trench 14 is formed. In an embodiment, the trench 14 is formed through a second masking and a dry etch process. However, the trench 14 may be otherwise formed in different embodiments. As shown, the trench 14 passes through the interface 30 and extends into both of the body portion 26 and the drift region portion 28. Thereafter, as shown in FIG. 6, a gate oxidation and a polysilicon deposition process are performed so that the gate 16 may be formed. The size and dimensions of the gate 16 are defined through a third masking and an etch process. Again, a dry etch or other suitable etch process may be implemented to form the gate 16.

Figure 7:
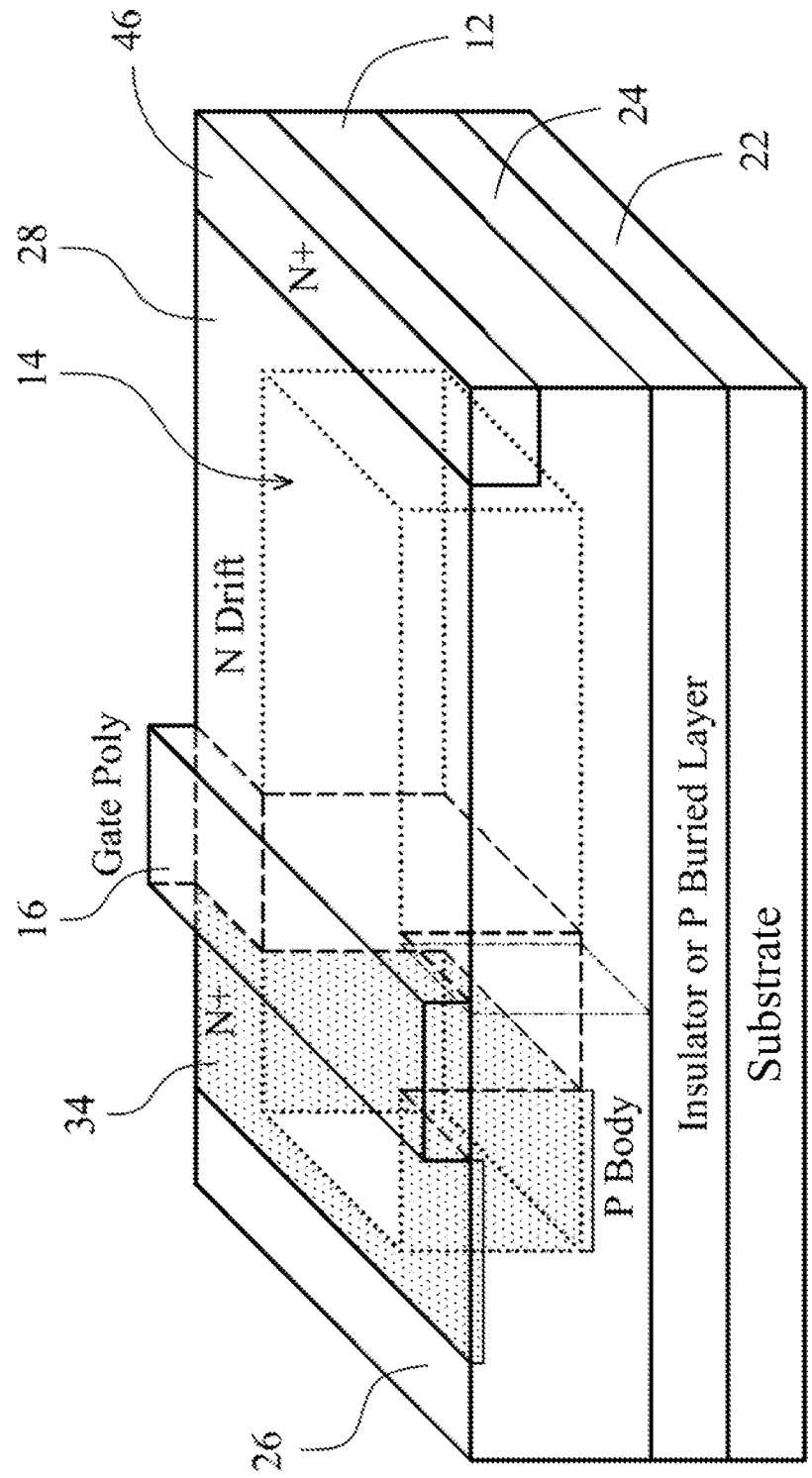
Figure 8:
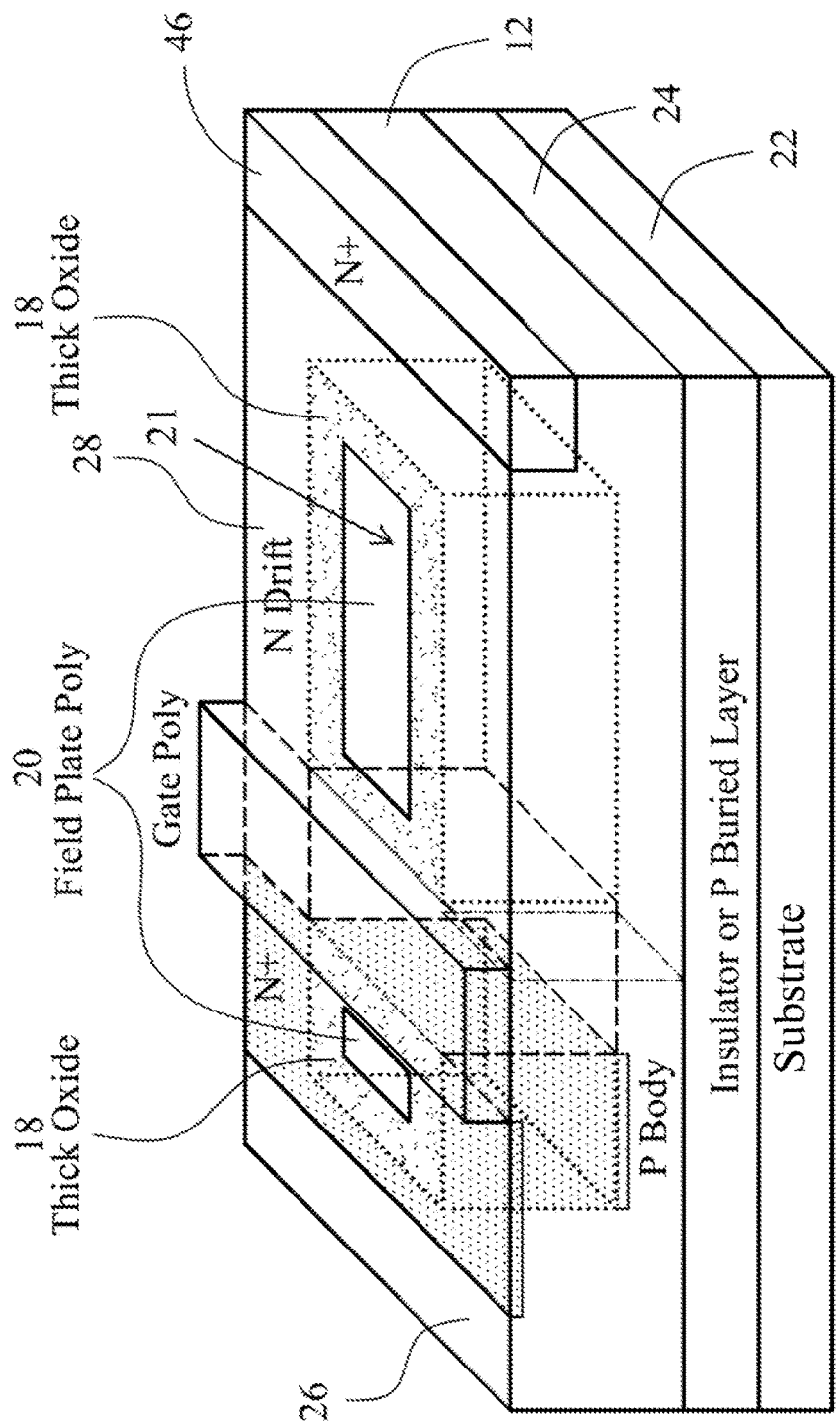

Moving to FIG. 7, a fourth masking is performed and the body portion 26 of the pad layer 12 adjacent the gate 16 is subjected to an n-type implantation process to generate the heavily n-doped thin layer 34 and the heavily-doped n+ region 46. Thereafter, as shown in FIG. 8, an oxide deposition process and a polysilicon deposition process are performed to deposit an oxide and then a polysilicon (not shown) over the entire structure. Once the oxide an polysilicon have been deposited, a fifth masking process, a polysilicon etch process, and an oxide etch process are performed to define the field plate 21, which is embedded in the dielectric material 18, as shown in FIG. 8.

Figure 9:
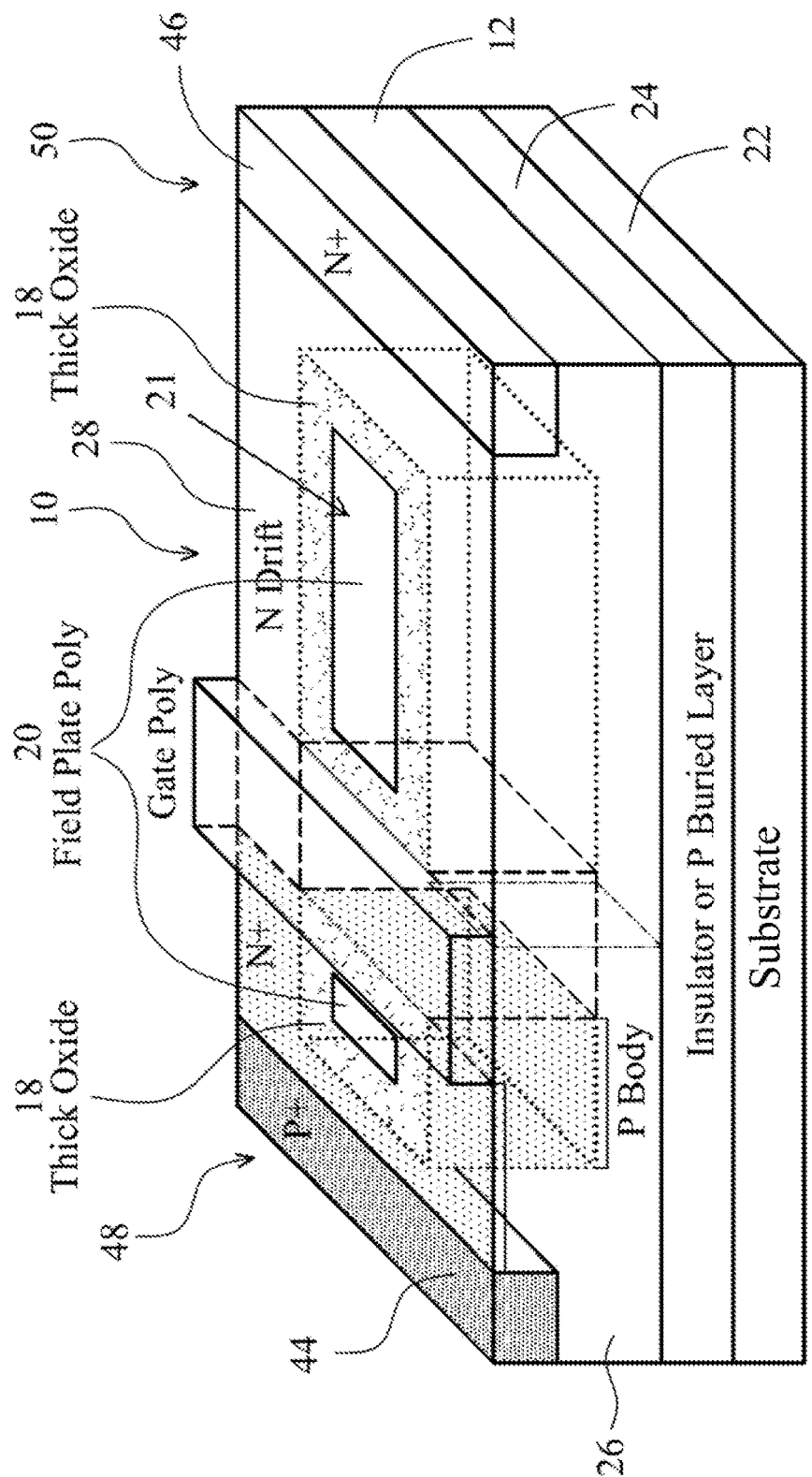

As shown in FIG. 9, a sixth masking process and a p-type implantation process are performed to complete the source 48 on the side of the gate 16 opposite the drain 50. Thereafter, a seventh masking process and metallization may take place. In addition, an eighth masking and a passivation process (not shown) may be performed to complete the formation of an embodiment FinFET device 10. It should be appreciated that other conventional or known semiconductor processing or fabrication steps, which have not been specifically described in detail herein for the sake of brevity, may be incorporated into or form part of the method of forming the FinFET device 10 schematically and collectively illustrated by FIGS. 4-9.

From the foregoing, it should be appreciated that the FinFET device 10 provides reduced channel and drift region resistances and reduced overall device specific on-resistance. The FinFET device 10 is also formed using a simplified process with a reduced mask count by using the same trench to form the source, the gate (a.k.a., the folded gate), and the field plate. In addition, several of the FinFET devices 10, each having a different breakdown voltage, may be fabricated on the same silicon by adjusting the length of the field plate and/or drift region. Moreover, the FinFET device 10 may be integrated with other devices on the same silicon.

In an embodiment, an integrated circuit device includes a pad layer having a body portion with a first doping type laterally adjacent to a drift region portion with a second doping type, a trench formed in the pad layer, the trench extending through an interface of the body portion and the drift region portion, a gate formed in the trench and over a top surface of the pad layer along the interface of the body portion and the drift region portion, an oxide formed in the trench on opposing sides of the gate, and a field plate embedded in the oxide on each of the opposing sides of the gate.

In an embodiment, an integrated circuit device includes a substrate, a pad layer supported by the substrate, the pad layer having a body portion with a first doping type laterally adjacent to a drift region portion with a second doping type, a trench formed in the pad layer, the trench extending through an interface of the body portion and the drift region portion, a gate formed in the trench and over a portion of the top surface of the pad layer, the gate extending along the interface of the body portion and the drift region portion, an oxide formed in the trench on opposing sides of the gate, and a field plate embedded in the oxide on each of the opposing sides of the gate.

In an embodiment, a method of forming a FinFET is provided. The method includes forming a trench in a pad layer having a body portion with a first doping type laterally adjacent to a drift region portion with a second doping type, the trench extending through an interface of the body portion and the drift region portion, forming a gate in the trench and over a top surface of the pad layer along the interface of the body portion and the drift region portion, depositing an oxide in the trench on opposing sides of the gate, and embedding a field plate in the oxide on each of the opposing sides of the gate.

While the disclosure provides illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. A method of forming a fin field effect transistor (FinFET) device, the method comprising:
   forming a trench in a pad layer having a body portion with a first doping type laterally adjacent to a drift region portion with a second doping type, the trench extending through an interface of the body portion and the drift region portion, opposing sidewalls of the trench being portions of the pad layer;
   forming a gate in the trench and over a top surface of the pad layer, the gate comprising a gate dielectric and a gate electrode, the gate extending continuously along and directly contacts the opposing sidewalls and a bottom of the trench, the gate overlapping the interface of the body portion and the drift region portion;
   depositing a dielectric material in the trench on opposing sides of the gate; and
   embedding a first field plate in the dielectric material on a first side of the gate.

2. The method of claim 1, further comprising forming a source along sidewalls of the trench.

3. The method of claim 2, wherein the source extends along an upper surface of the body portion.

4. The method of claim 3, wherein the source comprises dopants of the second doping type, the source having a higher concentration of the second doping type than the drift region portion.

5. The method of claim 1, further comprising orienting a longest dimension of the trench orthogonal to a longest dimension of the gate.

6. The method of claim 1, further comprising forming a second field plate in the dielectric material on a second side of the gate.

7. The method of claim 1, wherein an upper surface of the first field plate is coplanar with an upper surface of the dielectric material.

8. The method of claim 1, wherein the first field plate is spaced apart from the gate.

9. A method of forming a fin field effect transistor (FinFET) device, the method comprising:
   forming a pad layer having a first portion having a first conductivity type and a second portion having a second conductivity type, the pad layer having a trench, the trench being in the first portion and the second portion, wherein the first portion extends to an upper surface of the pad layer and the second portion extends to the upper surface of the pad layer, wherein the first portion is a first continuous portion and the second portion is a second continuous portion, and wherein the trench is a single continuous trench;
   forming a gate structure over the first portion and the second portion, the gate structure extending from a bottom of the trench to the upper surface of the pad layer;
   forming a first source/drain region in the first portion, the first source/drain region having a second conductivity type; and
   forming a dielectric material in the trench on opposing sides of the gate structure.

10. The method of claim 9, further comprising forming a first field plate in the dielectric material in the trench in the second portion of the pad layer.

11. The method of claim 10, wherein the first field plate is embedded in the dielectric material.

12. The method of claim 10, further comprising forming a second field plate in the dielectric material in the trench in the first portion of the pad layer.

13. The method of claim 12, where the first field plate and the second field plate are formed of polysilicon.

14. The method of claim 9, wherein a dopant concentration of the second conductivity type in the first source/drain region is greater than a dopant concentration of the second conductivity type in the second portion.

15. A method of forming a fin field effect transistor (FinFET) device, the method comprising:
   forming a first portion of a pad layer having dopants of a first conductivity type and a second portion of the pad layer having dopants of a second conductivity type, the pad layer being over an insulator layer, the dopants of the first conductivity type in the first portion extending to an upper surface of the pad layer, the dopants of the second conductivity type in the second portion extending to the upper surface of the pad layer;
   forming a trench in the first portion and the second portion of the pad layer, the trench having a first sidewall, a second sidewall, and a bottom extending between the first sidewall and the second sidewall, the first sidewall comprising the first portion and the second portion, the second sidewall comprising the first portion and the second portion;
   forming a gate structure extending along the first sidewall and the second sidewall of the trench, the gate structure overlying at least a part of the first portion and at least a part of the second portion;
   forming a doped region along a sidewalls of the trench in the first portion, the doped region having dopants of the second conductivity type; and
   forming a dielectric material in the trench on opposing sides of the gate structure.

16. The method of claim 15, further comprising forming a first field plate in the dielectric material in the trench in the second portion of the pad layer.

17. The method of claim 16, wherein the first field plate is laterally spaced apart from the gate structure.

18. The method of claim 16, further comprising forming a second field plate in the dielectric material in the trench in the first portion of the pad layer.

19. The method of claim 18, where the first field plate and the second field plate are formed of polysilicon.

20. The method of claim 15, wherein a dopant concentration of the second conductivity type in the doped region is greater than a dopant concentration of the second conductivity type in the second portion.

* * * * *